US00RE47936E

(19) United States
(12) Reissued Patent
Li et al.

(10) Patent Number: US RE47,936 E
(45) Date of Reissued Patent: Apr. 7, 2020

(54) DECODING METHOD AND DECODING DEVICE FOR POLAR CODE CASCADED WITH CYCLIC REDUNDANCY CHECK

(71) Applicant: HUAWEI TECHNOLOGIES CO., LTD., Shenzhen, Guangdong (CN)

(72) Inventors: Bin Li, Shenzhen (CN); Hui Shen, Shenzhen (CN)

(73) Assignee: HUAWEI TECHNOLOGIES CO., LTD., Shenzhen (CN)

(21) Appl. No.: 15/802,376

(22) Filed: Nov. 2, 2017

Related U.S. Patent Documents

Reissue of:
(64) Patent No.: 9,178,532
Issued: Nov. 3, 2015
Appl. No.: 14/335,362
Filed: Jul. 18, 2014

U.S. Applications:
(63) Continuation of application No. PCT/CN2012/076029, filed on May 25, 2012.

(30) Foreign Application Priority Data

Jan. 20, 2012 (CN) ..... 2012 1 0019078

(51) Int. Cl.
*H03M 13/11* (2006.01)
*H03M 13/09* (2006.01)
(Continued)

(52) U.S. Cl.
CPC ..... *H03M 13/09* (2013.01); *H03M 13/1111* (2013.01); *H03M 13/13* (2013.01); *H04L 1/0057* (2013.01)

(58) Field of Classification Search
CPC .. H03M 13/09; H03M 13/13; H03M 13/1111; H04L 1/0057
See application file for complete search history.

(56) References Cited

U.S. PATENT DOCUMENTS 9,628,113 B2 * 4/2017 Jeong ..... H03M 13/2906
9,966,973 B2 * 5/2018 Li ..... H03M 13/155
(Continued)

FOREIGN PATENT DOCUMENTS

CN 101373978 A 2/2009
CN 101488823 A 7/2009
(Continued)

OTHER PUBLICATIONS

Stolte, Norbert; "Recursive Codes with the Plotkin-Construction and Their Decoding"; Thesis in Electronics and Information Technology of the University of Technology Darmstadt, Germany; May 23, 2003; pp. 1-144. (English Translation).*
(Continued)

*Primary Examiner* — William H. Wood
(74) *Attorney, Agent, or Firm* — Huawei Technologies Co., Ltd.

(57) ABSTRACT

The embodiments of the present invention provide a decoding method and a decoding device for a polar code cascaded with CRC. The decoding method includes: performing SC-List decoding on a Polar code according to the number of survival paths L to obtain L survival paths, where L is a positive integer; performing cyclic redundancy check on the L survival paths respectively; and increasing the number of survival paths when all the L survival paths fail to pass the cyclic redundancy check, and acquiring a decoding result of the Polar code according to the increased number of survival paths. In the embodiments of the present invention, the path number of survival paths is adjusted according to a result of the cyclic redundancy check, so as to output paths as much as possible, where the output paths can pass the cyclic redundancy check, thereby improving decoding performance.

29 Claims, 3 Drawing Sheets

(51) Int. Cl.
*H03M 13/13* (2006.01)
*H04L 1/00* (2006.01)

(56) References Cited

U.S. PATENT DOCUMENTS

| | | | | |
|---|---|---|---|---|
| 10,103,752 | B2 * | 10/2018 | Li | H04L 1/0045 |
| 2002/0016945 | A1 * | 2/2002 | Sayood et al. | 714/779 |
| 2013/0111291 | A1 * | 5/2013 | Ma | H04L 1/0009 714/752 |
| 2014/0019820 | A1 * | 1/2014 | Vardy | H03M 13/13 714/752 |
| 2015/0222295 | A1 * | 8/2015 | Li | H04L 1/0045 714/755 |
| 2017/0187396 | A1 * | 6/2017 | Jeong | H03M 13/2915 |
| 2018/0048418 | A1 * | 2/2018 | Ge | H04L 1/0038 |
| 2018/0192403 | A1 * | 7/2018 | Shelby | H04L 1/0041 |
| 2018/0367163 | A1 * | 12/2018 | Saber | H03M 13/13 |

FOREIGN PATENT DOCUMENTS

| | | | | |
|---|---|---|---|---|
| CN | 101951266 | A | 1/2011 | |
| WO | 2008011345 | A2 | 1/2008 | |
| WO | WO 2008/011345 | A2 | 1/2008 | |
| WO | WO-2017125046 | A1 * | 7/2017 | H03M 13/2927 |

OTHER PUBLICATIONS

Arikan, Erdal; "Channel Polarization: A Method for Constructing Capacity-Achieving Codes"; Electrical-Electronics Engineering Department Bilkent University, Ankara, Turkey; IEEE, ISIT 2008; 2008; pp. 1173-1177.*

Li, et al.; "An Adaptive Successive Cancellation List Decoder for Polar Codes with Cyclic Redundancy Check"; IEEE Communication Letters, vol. 16, No. 12, Dec. 2012; pp. 2044-2047.*

El-Khamy et al.; "Binary polar codes are optimised codes for bitwise multistage decoding"; Electronics Letters, vol. 52, No. 13; Jun. 23, 2016; pp. 1130-1132.*

Tal, et al.; "List Decoding of Polar Codes"; arXiv:1206.0050v1 [cs.IT]; May 31, 2012; pp. 1-11.*

Tal, et al.; "List Decoding of Polar Codes"; IEEE Transactions on Information Theory, vol. 61, No. 5, May 2015; pp. 2213-2226.*

Eslami, et al.; "A Practical Approach to Polar Codes"; 2011 IEEE International Symposium on Information Theory Proceedings; 2011; pp. 16-20.*

Seidl, et al. "Improving Successive Cancellation Decoding of Polar Codes by Usage of Inner Block Codes"; 2010 6$^{th}$ International Symposium on Turbo Codes & Iterative Information Processing; IEEE, 2010; pp. 103-106.*

Trang, et al.; "The Performance of Polar Codes in Distributed Source Coding"; 2012 Fourth International Conference on Communications and Electronics (ICCE), Aug. 2012; IEEE 2012; pp. 196-199.*

English Translation of CN 103220001 A. (Year: 2013).*

English Translation of WO/2013/107140, PCT/CN2012/076029 (Year: 2013).*

English Translation of Certified copy of priority document CN 201210019078.9 (Year: 2012).*

Seyed Ali Gorji Zadeh, et al., "An Adaptive M-Algorithm Convolutional Decoder",Vehicular Technology Conference, IEEE 2005, Sep. 25, 2005, p. 2177-2181,total 6 pages.

Maruf Mohammad, et al., "A Comparison Between the M-Algorithm and the List Viterbi Algorithm", Military Communications Conference, IEEE 2008, Nov. 16, 2008, p. 1-5,total 5 pages.

Toshihiro Niinomi, et al., "A New Decoding Algorithm Using Likelihood Ratio Testing for Tree Codes", Transactions of the Institute of Electronics, Information and Communication Engineers, vol. J87-A, No. 2, Feb. 2004, p. 224-233,with an English abstract, total 11 pages.

Dumer, I.;Shabunov,k.,"Soft-decision decoding of Reed-Muller codes:recursive lists,"Information Theory, IEEE Transactions on, vol. 52, No. 3,pp. 1260,1266,Mar. 2006,total 7 pages.

Ali, M.; Kuijper, M., "Source coding with side information using list decoding," Information Theory Proceedings (ISIT), 2010 IEEE International Symposium on, vol., No., pp. 91,95, 13-18 Jun. 2010,total 5 pages.

Erdal Arikan, "Channel polarization: A method for constructing capacity-achieving codes for symmetric binary-input memoryless channels", Jul. 20, 2009, 23 pages.

Viveck R. Cadambe, et al., "Interference Alignment and Spatial Degrees of Freedom for the K User Interference Channel", Jul. 11, 2007, 30 pages.

Ido Tal, et al., "List Decoding of Polar Codes", 2011 IEEE International Symposium on Information Theory Proceedings, 2011, 5 pages.

Toshihiro Niinomi, et al., "A New Decoding Algorithm Using Likelihood Ratio Testing for Tree Codes", Feb. 2004, p. 224-233.

* cited by examiner

DECODING METHOD AND DECODING DEVICE FOR POLAR CODE CASCADED WITH CYCLIC REDUNDANCY CHECK

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application *is a Reissue Application of patent application Ser. No. 14/335,362 filed on Jul. 18, 2014, issued as U.S. Pat. No. 9,178,532 B2 on Nov. 3, 2015, which* is a continuation of International Application No. PCT/CN2012/076029, filed on May 25, 2012[, which]. *The international application* claims priority [of the] *to* Chinese Patent Application No. 201210019078.9, filed on Jan. 20, 2012[, both of which are ]. *All of the aforementioned patent applications are hereby* incorporated by [references] *reference* in their entities.

TECHNICAL FIELD

The embodiments of the present invention relate to the encoding/decoding field, and in particular, to a decoding method for a Polar code (polar code) cascaded with CRC (Cyclic Redundancy Check, cyclic redundancy check).

BACKGROUND

In a communication system, channel encoding is usually adopted to improve reliability of data transmission and ensure quality of communication. A Polar code is a good code which has been proved to be capable of acquiring Shannon capacity and has low encoding/decoding complexity. A Polar code is a linear block code. Its generator matrix is $G_N$, and its encoding process is $x_1^N=u_1^N G_N$, where, $G_N=B_N F^{\otimes n}$ and a code length is $N=2^n$, $n\geq 0$.

Here, $$F=\begin{bmatrix}1 & 0\\ 1 & 1\end{bmatrix},$$

$B_N$ is a transposed matrix, such as a bit reversal (bit reversal) matrix.

$F^{\otimes n}$ is a Kronecker power (Kronecker power) of F, and is defined as $F^{\otimes n}=F\otimes F^{\otimes(n-1)}$. The Polar code may be expressed as (N, K, A, $u_{A^c}$) by using a coset code. Its encoding process is: $x_1^N=u_A G_N(A)\oplus u_{A^c} G_N(A^C)$, where, A is a set of [an] information [(information)] bit [index] *indices*, $G_N(A)$ is a submatrix obtained according to rows [that correspond] *where each row corresponds* to an index of the set A in $G_N$, and $G_N(A^C)$ is a submatrix obtained according to rows [that correspond] *where each row corresponds* to an index of a set $A^C$ in $G_N$. $u_{A^c}$ [is a] *are* frozen [(frozen) bit] *bits* and [is a] *are* known [bit] *bits*, where the number of frozen bits is (N−K). For simplicity, these frozen bits may be set to 0.

Decoding of the Polarcodemayuse SC (successive-cancellation, successive-cancellation) decoding, and its process is as follows:

Consider a kind of Polar code, whose parameter is (N, K, A, $u_{A^c}$).

In SC decoding, the following conditional likelihood functions are calculated sequentially:

$$L_N^{(i)}(y_1^N, \hat{u}_1^{i-1}) \triangleq \frac{W_N^{(i)}(y_1^N \cdot \hat{u}_1^{i-1} \mid 0)}{W_N^{(i)}(y_1^N \cdot \hat{u}_1^{i-1} \mid 1)} \tag{1}$$

If $i\subset A$, decision is made as follows:

$$\hat{u}_i=\begin{cases}0, & \text{if } L_N^{(i)}(y_1^N, \hat{u}_1^{i-1})\geq 1\\ 1, & \text{in other cases}\end{cases} \tag{2}$$

$$\text{If } i\subset A^C, \text{ simply assume } \hat{u}_i=u_i \tag{3}$$

In the foregoing formulas (2) and (3), $\hat{u}_i$ represents a decision value of bit $u_i$.

The complexity of the SC decoding is 0 (N $\log_2$N). The SC decoding may have good performance and approximate the Shannon limit in the case that the code length N is very long, but when N is relatively short or has an intermediate length, performance of the SC decoding of the Polar code does not exceed performance of a Turbo code and an LDPC (Low-density Parity-check, low-density parity-check) code, and decoding performance needs to be further improved.

Decoding is performed sequentially bit by bit during the SC decoding. After decoding of each bit is completed, a decoded bit is used for subsequent bit decoding after hard decision is performed, and in this way, wrong propagation may exist, thereby causing degradation of the decoding performance. List (list) decoding reserves a plurality of candidate paths and can have decoding performance that approximates the maximum likelihood. SC-List decoding is obtained through the combination of the SC decoding and the List decoding.

A process of the SC-List decoding of the Polar code is briefly described as follows:

Path split: whenever $\hat{u}_i$ is an information bit (information bit), a current decoding path is split into two paths: one path in the case of $\hat{u}_i=0$ and the other path in the case of $\hat{u}_i=1$. When the total number of paths exceeds a pre-defined threshold L, a most unreliable path is discarded, only L most reliable paths (called survival path) are maintained; and furthermore, probability values or LLRs (Log-Likelihood Ratio, log-likelihood ratio) on all the paths are updated.

No path split: if $\hat{u}_i$ is a frozen bit, all decoding paths are not split. It is assumed that $\hat{u}_i=u_i$, the number of paths is maintained unchanged and probability values (or LLRs) of all the paths are updated.

Existing SC-List decoding adopts the fixed number of survival paths L, and the complexity of the decoding is O ($L\times N\times\log_2 N$).

By adopting a scheme of cascading CRC and the Polar code, the Hamming distance (Hamming Distance) can be increased and performance of a code in a high SNR interval can be improved. A simulation result indicates that performance of the cascading scheme is the same as performance of a Turbo code and an LDPC code. However, if a value of the fixed number of existing survival paths is excessively small, a demand for the decoding performance cannot be satisfied; and if a value is excessively large, the decoding complexity is increased.

SUMMARY

The embodiments of the present invention provide a decoding method and a decoding device for a polar code, so that decoding performance of the polar code can be improved.

In one aspect, a decoding method for a Polar code is provided and includes: performing SC-List decoding on a Polar code according to the number of survival paths L to obtain L survival paths, where L is a positive integer; performing cyclic redundancy check on the L survival paths respectively; and increasing the number of survival paths when all the L survival paths fail to pass the cyclic redundancy check and acquiring a decoding result of the Polar code according to the increased number of survival paths.

In another aspect, a decoding device is provided and includes: a decoder, configured to perform SC-List decoding on a Polar code according to the number of survival paths L to obtain L survival paths, where L is a positive integer; a checker, configured to perform cyclic redundancy check respectively on the L survival paths that is obtained by the decoder; and a selector, configured to increase the number of survival paths when all the L survival paths fail to pass the cyclic redundancy check and acquire a decoding result of the Polar code according to the increased number of survival paths.

In the embodiments of the present invention, the path number of survival paths is adjusted according to a result of cyclic redundancy check, so as to output paths as much as possible, where the output paths can pass the cyclic redundancy check, thereby improving decoding performance.

DETAILED DESCRIPTION

The technical solutions in the embodiments of the present invention are described clearly and completely in the following with reference to the accompanying drawings in the embodiments of the present invention. Apparently, the embodiments to be described are only a part rather than all of the embodiments of the present invention. Based on the embodiments of the present invention, all other embodiments obtained by persons of ordinary skill in the art without creative efforts shall fall within the protection scope of the present invention.

The embodiments of the present invention may be applied in various communication systems. Therefore, the following descriptions are not limited to a specific communication system, such as a global system of mobile communication, (Global System of Mobile communication, "GSM" for short) system, a code division multiple access (Code Division Multiple Access, "CDMA" for short) system, a wideband code division multiple access (Wideband Code Division Multiple Access, "WCDMA" for short) system, a general packet radio service (General Packet Radio Service, "CPRS" for short), a long term evolution (Long Term Evolution, "LTE" for short) system, an LTE frequency division duplex (Frequency Division Duplex, FDD for short) system, an LTE time division duplex (Time Division Duplex, "TDD" for short), and a universal mobile telecommunication system (Universal Mobile Telecommunication System, "UMTS" for short). All information or data encoded and processed by a base station or a terminal by using a conventional Turbo code and LDPC code in the foregoing systems may be encoded by using a Polar code in this embodiment.

Figure 1:
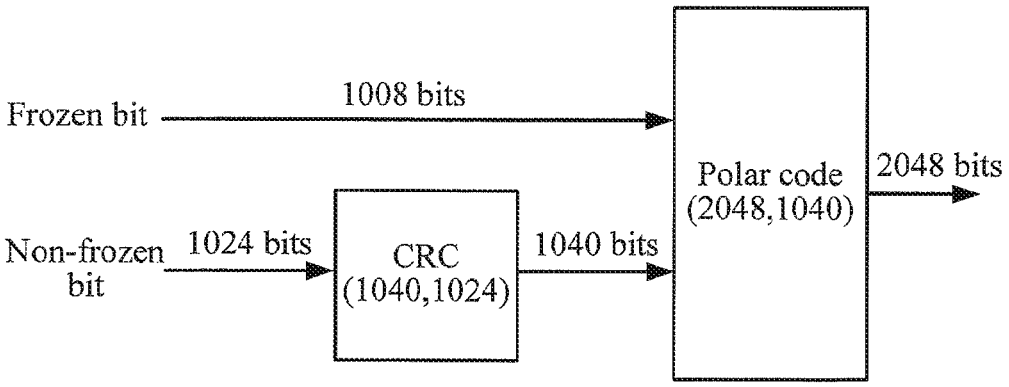
FIG. 1 is a schematic diagram of a scheme for cascading a Polar code and CRC.

FIG. 1 is a schematic diagram of a scheme for cascading a Polar code and CRC. Simulation indicates that in the case of an intermediate code length, performance of the cascading scheme is equivalent to that of a Turbo code and an LDPC code.

As shown in FIG. 1, in the scheme of cascading CRC and a Polar code, firstly CRC check is performed on [a] non-frozen [bit] *bits* (for example, [a bit whose] *the* length is 1024 bits) to obtain [a] corresponding CRC check [bit] *bits* (for example, [its] *the* length is 1040 bits). Then Polar encoding is performed on the CRC check [bit] *bits* and [a] frozen [bit] *bits* (for example, [its] *the* length is 1008 bits) to obtain a Polar code (for example, [its] *the* length is 2048 bits).

In this embodiment of the present invention, the Polar code obtained in a manner exemplified in FIG. 1 may be decoded. However, it should be noted that a value of the bit length in FIG. 1 is only exemplary and this embodiment of the present invention is not limited to this. For example, a code length of the Polar code that may be decoded in this embodiment of the present invention may not be 2048.

Figure 2:
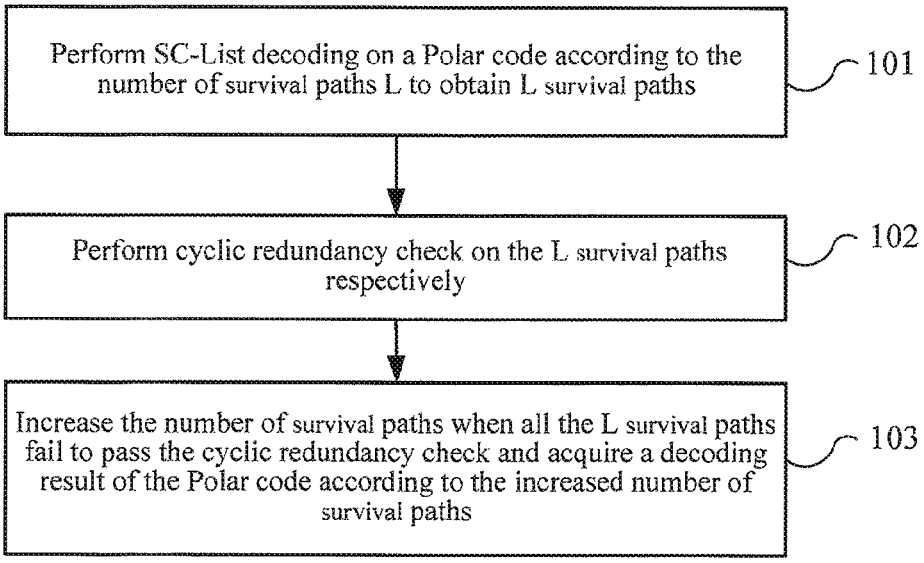
FIG. 2 is a flow chart of a decoding method for a Polar code according to an embodiment of the present invention.

FIG. 2 is a flow chart of a decoding method for a Polar code cascaded with CRC according to an embodiment of the present invention. The method in FIG. 2 is executed by a decoding end.

101: Perform SC-List decoding on a Polar code according to the number of survival paths L to obtain L survival paths, where L is a positive integer.

For example, the Polar code may be a Polar code that is cascaded with CRC and generated in the manner shown in FIG. 1. A manner for performing SC-List decoding on the Polar code is not limited in this embodiment of the present invention, for example, reference may be made to the prior art for performing the SC-List decoding.

102: Perform cyclic redundancy check on the L survival paths respectively.

In a SC-List decoding process of the Polar code, the SC-List decoding is generally decoding in bit-by-bit (Bit) serial. Starting from a first bit, the first bit may be 0 or 1, and a second bit may also be 0 or 1, so that a tree structure may be formed from the first bit to a currently decoded bit. A path is formed from a root node to a leaf node of the tree. A survival path is a path left by screening in a decoding process, which actually indicates a probable result of the decoding.

103: Increase the number of survival paths when all the L survival paths fail to pass the cyclic redundancy check and acquire a decoding result of the Polar code according to the increased number of survival paths.

In this embodiment of the present invention, the path number of survival paths is adjusted according to a result of the cyclic redundancy check, so as to output paths as much as possible, where the output paths can pass the cyclic redundancy check, thereby improving decoding performance.

Optionally, as an embodiment, in step 103, if the increased number of survival paths is less than or equal to a threshold value, the method in FIG. 1 is re-executed according to the increased number of survival paths to acquire a decoding result of the Polar code. Or, if the increased number of survival paths is greater than a threshold value, a survival path with a greatest probability value among the L survival paths is output as the decoding result of the Polar code. In this way, the decoding performance is improved, and meanwhile, it is ensured that the decoding complexity is not excessively high.

Therefore, the complexity of the SC-List decoding may be reduced by lowering the threshold value. In addition, if the threshold value is increased, performance in a high SNR (Signal Noise Ratio, signal noise ratio) interval in this embodiment of the present invention may be improved. A setting manner and a specific value of the threshold value are not limited in this embodiment of the present invention, for example, the setting may be performed according to a demand for the decoding complexity and/or a demand for the decoding performance.

A manner for increasing the number of survival paths is not limited in this embodiment of the present invention, as long as the number of survival paths is increased in a strictly monotonic increasing way. Optionally, as another embodiment, when the number of survival paths is increased in step 103, the number of survival paths may be increased by m, where m is a positive integer, or the number of survival paths is multiplied by n, where n is greater than 1. The foregoing m or n may be a fixed value or a variable value, which is not limited in this embodiment of the present invention.

Optionally, as another embodiment, if one or multiple of the L survival paths pass the cyclic redundancy check, a survival path with a greatest probability value of the one or multiple of survival paths may be output as the decoding result of the Polar code.

Setting an initial value of the number of survival paths is not limited in this embodiment of the present invention. Optionally, as another embodiment, an initial value of the number of survival paths may be set according to a demand for the decoding complexity and/or a demand for the decoding performance. In this way, required time for acquiring the decoding result of the Polar code can be shortened and decoding efficiency can be improved.

Figure 3:
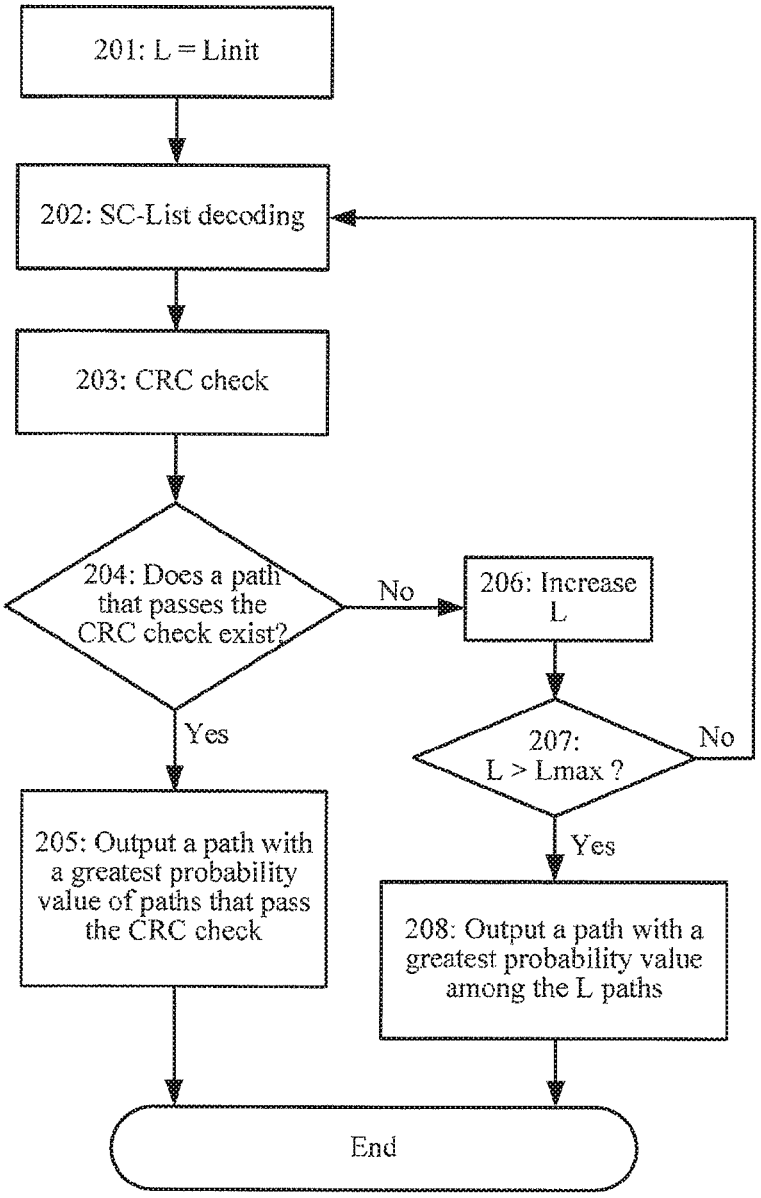
FIG. 3 is a schematic flow chart of a decoding process according to another embodiment of the present invention.

Embodiments of the present invention are described in further detail in the following with reference to specific examples. FIG. 3 is a schematic flowchart of a decoding process according to another embodiment of the present invention. The embodiment in FIG. 3 is a specific implementation manner of the method in FIG. 2. The adaptive number of survival paths L is adopted, so that decoding performance is improved.

201: Initialize the number of survival paths L=Linit.

Linit is a positive integer, such as 4, 8, or 16, and indicates an initial value of the number of survival paths. For example, the initial value of the number of survival paths may be set according to a demand for the decoding complexity and/or a demand for the decoding performance. In this way, required time for acquiring a decoding result of a Polar code can be shortened and decoding efficiency can be improved. However, neither a setting manner of Linit nor a specific value of Linit is limited in this embodiment of the present invention.

202: Perform SC-List decoding on a Polar code to obtain L survival paths.

203: Perform CRC (cyclic redundancy check) respectively on the L survival paths that are generated in step 202.

204: Determine, according to a check result in step 203, whether a survival path that passes the CRC exists.

205: If it is determined that one or multiple of survival paths pass the CRC in step 204 ("yes" in step 204), output a survival path with a greatest probability value of the one or multiple of survival paths as a decoding result.

206: Increase the number of survival paths L, for example, L=L+m (m is a positive integer) or L=L×n (n is greater than 1) if all the L survival paths fail to pass the CRC in step 204 ("no" in step 204). m or n may be a fixed value or a variable value, which is not limited in this embodiment of the present invention.

207: Judge whether the increased number of survival paths is greater than a threshold value Lmax. Lmax is greater than 1 and may be a preset value, such as 64, or 128. The threshold value Lmax of the number of survival paths may be set according to a demand for the decoding complexity and/or a demand for the decoding performance. In this way, required time for acquiring the decoding result can be shortened and the decoding efficiency can be improved. A setting manner and a specific value of the threshold value are not limited in this embodiment of the present invention.

If a judging result in step 207 is "no", namely, L≤Lmax, the method in the FIG. 2 returns to step 202, and step 202 and the procedure after step 202 are re-executed according to the increased number of survival paths, so as to acquire the decoding result.

208: If the judging result in step 207 is "yes", namely, L>Lmax, output a survival path with a greatest probability value among the current L survival paths as the decoding result.

In this way, in this embodiment of the present invention, the path number of survival paths is adjusted adaptively according to a result of the cyclic redundancy check, so as to output paths as much as possible, where the output paths can pass the cyclic redundancy check, thereby improving the decoding performance. In addition, the threshold value of the number of survival paths is set in this embodiment of the present invention, so that the decoding complexity can also be improved.

Figure 4:
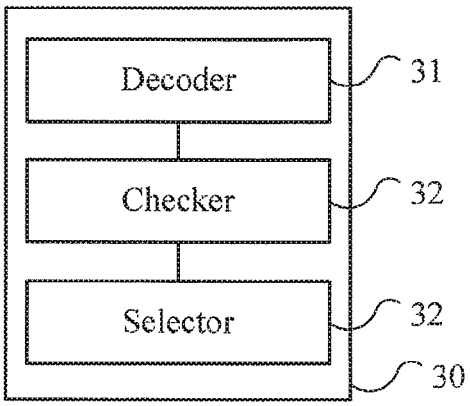
FIG. 4 is a block diagram of a decoding device according to an embodiment of the present invention.

FIG. 4 is a block diagram of a decoding device for a Polar code cascaded with CRC according to an embodiment of the present invention. A decoding device 30 in FIG. 4 may be any proper entity and may be used in decoding processing of a Polar code. The decoding device 30 includes a decoder 31, a checker 32, and a selector 33.

The decoder 31 performs SC-List decoding on a Polar code according to the number of survival paths L to obtain L survival paths, where L is a positive integer. The checker 32 performs cyclic redundancy check respectively on the L survival paths that are obtained by the decoder 31. The selector 33 increases the number of survival paths when all the L survival paths fail to pass the cyclic redundancy check of the checker 32 and acquires a decoding result according to the increased number of survival paths.

In this embodiment of the present invention, the path number of the survival paths is adjusted according to a result of the cyclic redundancy check, so that an optimal compromise can be obtained between decoding complexity and decoding performance.

The decoding device 30 in FIG. 4 may execute steps of the method shown in FIG. 2 or FIG. 3. To avoid repetition, no detailed description is provided again.

Optionally, as an embodiment, the selector 33 may output the increased number of survival paths to the decoder 31 when the increased number of survival paths is less than or equal to a threshold value, so that the decoder 31 performs the SC-List decoding on the Polar code again according to the increased number of survival paths. Or, the selector 33 may output a survival path with a greatest probability value among the L survival paths as the decoding result when the increased number of survival paths is greater than a threshold value. In this way, the decoding performance is improved and meanwhile, it is ensured that the decoding complexity is not excessively high.

Optionally, as another embodiment, the selector 33 may increase the number of survival paths by m, where m is a positive integer, or multiply the number of survival paths by n, where n is greater than 1. The foregoing m or n may be a fixed value or a variable value, which is not limited in this embodiment of the present invention.

Optionally, as another embodiment, if one or multiple of the L survival paths pass the cyclic redundancy check, the selector 33 may also output a survival path with a greatest probability value of the one or multiple of survival paths as the decoding result.

Optionally, as another embodiment, the decoder 31 may further set an initial value of the number of survival paths according to a demand for the decoding complexity and/or a demand for the decoding performance. In this way, required time for acquiring the decoding result can be shortened and decoding efficiency can be improved.

Figure 5:
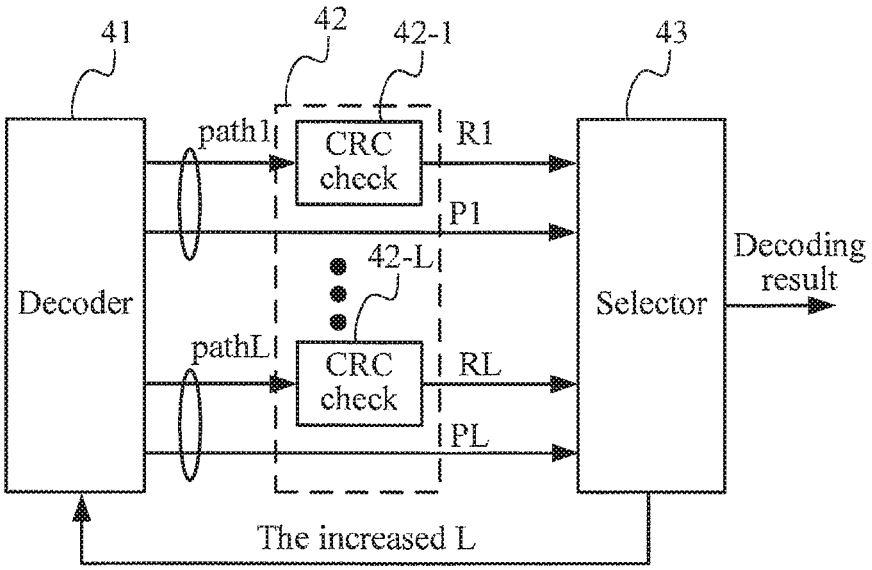
FIG. 5 is a block diagram of a decoding device according to another embodiment of the present invention.

FIG. 5 is a block diagram of a decoding device according to another embodiment of the present invention. A decoding device 40 in FIG. 5 is a specific implementation manner of the decoding device 30 in FIG. 3. The adaptive number of survival paths L is adopted, so that decoding performance is improved.

As shown in FIG. 5, the decoding device 40 includes a decoder 41, a checker 42, and a selector 43.

The decoder 41 performs SC-List decoding on a Polar code to obtain L survival paths. For example, the Polar code may be a cascade code generated in the manner shown in FIG. 1. The decoder 41 outputs the L survival paths path1 to pathL to the checker 42 respectively to perform CRC check. In addition, the decoder 41 outputs probability values P1 to PL of the L survival paths to the selector 43 respectively.

To illustrate the drawing clearly, the checker 42 in FIG. 5 is described as L checkers 42-1 to 42-L, but the description is merely exemplary, and is not intended to limit this embodiment of the present invention. Functions of the L checkers 42-1 to 42-L may be implemented by one checker 42. In the specification, the checkers 42-1 to 42-L may be called a checker 42 collectively.

The checker 42 performs CRC check on the L survival paths path1 to pathL respectively, and output check results R1 to RL of the L survival paths to the selector 43 respectively. A check result may indicate whether a survival path passes the CRC check (pass) or fails to pass the CRC check (fail).

The selector 43 determines, according to the check result of the checker 42, whether a survival path that passes the CRC check exists. If k ($1 \leq k \leq L$, and k is a positive integer) survival paths pass the CRC check, the selector 43 may select a survival path with a greatest probability value as a decoding result according to probability values of the k survival paths output by the decoder 41.

In another aspect, if all the L survival paths fail to pass the CRC check of the checker 42, the selector 43 may increase the number of survival paths, for example, $L=L+m$ (m is a positive integer) or $L=L \times n$ (n is greater than 1). If the increased number of survival paths does not exceed a preset threshold value $L_{max}$, the selector 43 returns the increased number of survival paths to the decoder 41. The decoder 41 performs the SC-List decoding on the Polar code again according to the increased number of survival paths, and the checker 42 and the selector 43 execute a subsequent procedure accordingly.

If the increased number of survival paths exceeds the preset threshold value $L_{max}$, the selector 43 selects a path with a greatest probability value among the current L survival paths as the decoding result, instead of returning the increased number of survival paths to the decoder 41.

In this way, in this embodiment of the present invention, the path number of survival paths is adjusted adaptively according to a result of the cyclic redundancy check, so as to output paths as much as possible, where the output paths can pass the cyclic redundancy check, thereby improving the decoding performance. In addition, the threshold value of the number of survival paths is set in this embodiment of the present invention, so that the decoding complexity can also be improved.

Simulation is performed according to an adaptive SC-List decoding scheme and a conventional SC-List decoding scheme in the embodiments of the present invention. In a simulation scene, a code length is 2048, a code rate is ½, and $L_{init}=4$ (in the conventional SC-List decoding scheme, the fixed number of paths L=32 is used), the number of survival paths is increased by $L=L \times 2$ each time, and $L_{max}=128$.A simulation result indicates that decoding complexity of the adaptive SC-List decoding scheme in the embodiments of the present invention can be decreased to about ⅛, and its decoding performance is better than the performance of the conventional SC-List decoding by 0.2 dB.

Persons of ordinary skill in the art may be aware that the various exemplary units and algorithm steps described with reference to the embodiments disclosed herein can be implemented by electronic hardware, or a combination of computer software and electronic hardware. Whether the functions are executed by hardware or software depends on particular applications and design constraint conditions of the technical solutions. Persons skilled in the art may use different methods to implement the described functions for every particular application, but it should not be considered that the implementation goes beyond the scope of the present invention.

It can be clearly understood by persons skilled in the art that, for the purpose of convenient and brief description, for a detailed working process of the foregoing system, device and unit, reference may be made to a corresponding process in the method embodiments, and the details are not described herein again.

In the embodiments provided in the present application, it should be understood that the disclosed system, device, and method may be implemented in other manners. For example, the described device embodiments are merely exemplary. For example, the unit division is merely logical function division and may be other division in actual implementation. For example, multiple units or components may be combined or integrated into another system, or some features may be ignored or not be performed. In addition, the displayed or discussed mutual couplings or direct couplings or communication connections are implemented through some interfaces. The indirect couplings or communication connections between the devices or units may be implemented in electronic, mechanical or other forms.

The units described as separate parts may or may not be physically separate, and parts displayed as units may or may not be physical units, may be located in one position, or may be distributed on multiple network elements. A part or all of the units may be selected according to an actual requirement to achieve the objectives of the solutions in the embodiments.

In addition, function units in the embodiments of the present invention may be integrated into one processing unit, or each of the units may exist alone physically, or two or more units are integrated into one unit.

When the functions are implemented in the form of a software function unit and sold or used as a stand-alone product, the functions may be stored in a computer-readable storage medium. Based on such understanding, the essence of the technical solutions in the present invention, or part that makes contributions to the prior art, or part of the technical solution may be embodied in the form of a software product. The computer software product may be stored in a storage medium, and includes several instructions for instructing a piece of computer equipment (for example, a personal computer, a server, or network equipment) to execute all or a part of the steps of the method described in each embodiment of the present invention. The storage medium may be any medium that is capable of storing program codes, such as a USB flash disk, a removable hard disk, a Read-Only Memory (ROM, Read-Only Memory), a Random Access Memory (RAM, Random Access Memory), a magnetic disk, or an optical disk. Persons skilled in the art may understand that the modules in the devices in the embodiments may be arranged in the devices in a distributed manner according to the description of the embodiments, or may be arranged in one or multiple devices which are different from those described in the embodiments. The modules may be combined into one module, and may also be split into multiple submodules.

What is claimed is:

1. A [decoding] method for *decoding* a Polar code cascaded with cyclic redundancy check [CRC], *performed by a decoding device,* the method comprising:

*receiving a Polar code, wherein the Polar code is obtained by encoding information bits;* performing*, according to a number of survival paths L, a* successive-cancellation-list (SC-List) decoding on [a] *the* Polar code*,* to obtain L survival paths, wherein L is a positive integer;

performing *a* cyclic redundancy check on *each of* the L survival paths [respectively];

increasing the number of survival paths *by* $\Delta L$ in response to all the L survival paths failing to pass the cyclic redundancy check*, wherein* $\Delta L$ *is a positive integer*; [and]

acquiring a decoding result of the Polar code according to the increased number of survival paths $L+\Delta L$*; and*

*outputting the decoding result.*

2. The method according to claim 1, wherein acquiring the decoding result of the Polar code according to the increased number of survival paths[,] $L+\Delta L$ comprises:

[if the increased number of survival paths is less than or equal to a threshold value, re-executing the method according to the increased number of survival paths to acquire the decoding result of the Polar code; or]

if the increased number of survival paths $L+\Delta L$ is greater than a threshold value, outputting a survival path with a greatest probability value among the $L+\Delta L$ survival paths as the decoding result of the Polar code.

3. The method according to claim 1, wherein increasing the number of survival paths *by* $\Delta L$ comprises:

increasing the number of survival paths $L$ by m, wherein m is a positive integer, or multiplying the number of survival paths $L$ by n, wherein n is greater than 1.

4. The method according to claim 1, further comprising:

if one or multiple of the L survival paths pass the cyclic redundancy check, outputting a survival path with a greatest probability value of the one or multiple of survival paths as the decoding result of the Polar code.

5. The method according to claim 1, further comprising:

setting an initial value of the number of survival paths according to a demand for decoding complexity or a demand for decoding performance.

6. A [decoding] device for *decoding* a Polar code cascaded with cyclic redundancy check [CRC], the device comprising:

*a processor and a memory coupled to the processor;*

*wherein, by executing program codes stored in the memory, the processor is configured to:*

[a decoder, configured to] perform*, according to a number of survival paths L, a* successive-cancellation-list (SC-List) decoding on [a] *the* Polar code to obtain L survival paths, *wherein the Polar code is obtained by encoding information bits, and* wherein L is a positive integer;

[a checker, configured to] perform cyclic redundancy check [respectively] on *each of* the L survival paths [that are obtained by the decoder]; [and a selector, configured to] increase the number of survival paths *by* $\Delta L$ in response to all the L survival paths failing to pass the cyclic redundancy check [and]*, wherein* $\Delta L$ *is a positive integer;* acquire a decoding result of the Polar code according to the increased number of survival paths $L+\Delta L$*; and*

*output the decoding result.*

7. The device according to claim 6, wherein the [selector] *processor* is configured to [output the increased number of survival paths to the decoder when the increased number of survival paths is less than or equal to a threshold value, so that the decoder performs the SC-List decoding on the Polar code again according to the increased number of survival paths; or] output a survival path with a greatest probability value among the $L+\Delta L$ survival paths as the decoding result of the Polar code when the increased number of survival paths $L+\Delta L$ is greater than a threshold value.

8. The device according to claim 6, wherein *in increasing the number of survival paths by* $\Delta L$*,* the [selector] *processor* is configured to*:* increase the number of survival paths $L$ by m, wherein m is a positive integer, or multiply the number of survival paths $L$ by n, wherein n is greater than 1.

9. The device according to claim 6, wherein the [selector] *processor* is further configured to, if one or multiple of the L survival paths pass the cyclic redundancy check, output a survival path with a greatest probability value of the one or multiple of survival paths as the decoding result of the Polar code.

10. The device according to claim 6, wherein the [decoder] *processor* is further configured to set an initial value of the number of survival paths according to a demand for decoding complexity or a demand for decoding performance.

*11. A method, performed by an encoding device, comprising:*

*obtaining a plurality of non-frozen bits;*

*performing a cyclic redundancy check (CRC) on the non-frozen bits, to obtain CRC checked bits;*

*adding one or more frozen bits to the CRC checked bits;*

*performing a polar encoding process on the CRC checked bits and the frozen bits, to obtain a polar code; and*

*outputting the polar code.*

*12. The encoding method according to claim 11, wherein the polar encoding process is expressed as:*

$$x_1^N = u_1^N G_N,$$

*wherein $x_1^N$ is the outputting polar code, $G_N$, is a generator matrix for the polar code, and $u_1^N$ are inputting bits, wherein the inputting bits include the CRC checked bits and the frozen bits.*

*13. The encoding method according to claim 12, wherein a length of the polar code is N, N=2^n, and n≥0.*

*14. The encoding method according to claim 11, wherein the polar code is configured for decoding using CRC check of one or more of L survival paths, wherein L is a positive integer.*

*15. The encoding method according to claim 11, wherein the polar code is configured for successive-cancellation-list (SC-List) decoding using CRC check of one or more of L survival paths.*

*16. The encoding method according to claim 11, wherein the polar code is configured for successive-cancellation-list (SC-List) decoding using a number L of survival paths adapted according to a result of CRC check of the survival paths.*

*17. An encoding device, comprising a processor and a memory storing program codes for execution by the processor, wherein the program codes, when executed by the processor, cause the encoding device to:*

*obtain a plurality of non-frozen bits;*

*perform a cyclic redundancy check (CRC) on the non-frozen bits, to obtain CRC checked bits;*

*add one or more frozen bits to the CRC checked bits;*

*perform a polar encoding process on the CRC checked bits and the frozen bits to obtain a polar code; and*

*output the polar code.*

*18. The encoding device according to claim 17, wherein the polar encoding process is expressed as:*

$$x_1^N = u_1^N G_N,$$

*wherein $x_1^N$ is the outputting polar code, $G_N$, is a generator matrix for the polar code, and $u_1^N$ are inputting bits, wherein the inputting bits include the CRC checked bits and the frozen bits.*

*19. The encoding device according to claim 18, wherein a length of the polar code is N, N=2^n, and n≥0.*

*20. The encoding device according to claim 17, wherein the polar code is configured for decoding using CRC check of one or more of L survival paths, wherein L is a positive integer.*

*21. The encoding device according to claim 17, wherein the polar code is configured for successive-cancellation-list (SC-List) decoding using CRC check of one or more of L survival paths.*

*22. The encoding device according to claim 17, wherein the polar code is configured for successive-cancellation-list (SC-List) decoding using a number L of survival paths adapted according to a result of CRC check of the survival paths.*

*23. The encoding device according to claim 17, wherein the encoding device is a base station or a terminal device.*

*24. A non-transitory computer-readable storage medium storing program codes which, when executed, cause an encoding device to:*

*obtain a plurality of non-frozen bits;*

*perform a cyclic redundancy check (CRC) on the non-frozen bits, to obtain CRC checked bits;*

*add one or more frozen bits to the CRC checked bits;*

*perform a polar encoding process on the CRC checked bits and the frozen bits to obtain a polar code; and*

*output the polar code.*

*25. The non-transitory computer-readable storage medium according to claim 24, wherein the polar encoding process is expressed as:*

$$x_1^N = u_1^N G_N,$$

*wherein $x_1^N$ is the outputting polar code, $G_N$, is a generator matrix for the polar code, and $u_1^N$ are inputting bits, wherein the inputting bits include the CRC checked bits and the frozen bits.*

*26. The non-transitory computer-readable storage medium according to claim 25, wherein a length of the polar code is N, N=2^n, and n≥0.*

*27. The non-transitory computer-readable storage medium according to claim 24, wherein the polar code is configured for decoding using CRC check of one or more of L survival paths, wherein L is a positive integer.*

*28. The non-transitory computer-readable storage medium according to claim 24, wherein the polar code is configured for successive-cancellation-list (SC-List) decoding using CRC check of one or more of L survival paths.*

*29. The non-transitory computer-readable storage medium according to claim 24, wherein the polar code is configured for successive-cancellation-list (SC-List) decoding using a number L of survival paths adapted according to a result of CRC check of the survival paths.*

* * * * *